US009768383B2

(12) United States Patent
Glowacki et al.

(10) Patent No.: US 9,768,383 B2
(45) Date of Patent: Sep. 19, 2017

(54) METHOD FOR APPLYING AN ORGANIC SEMICONDUCTOR LAYER BASED ON EPINDOLIDIONE TO A CARRIER

(71) Applicant: Universitaet Linz, Linz (AT)

(72) Inventors: Eric Daniel Glowacki, Linz (AT); Gundula Voss, Bayreuth (DE)

(73) Assignee: Universitaet Linz, Linz (AT)

( * ) Notice: Subject to any disclaimer, the term of this patent is extended or adjusted under 35 U.S.C. 154(b) by 96 days.

(21) Appl. No.: 14/911,775

(22) PCT Filed: Jul. 30, 2014

(86) PCT No.: PCT/AT2014/050169
§ 371 (c)(1),
(2) Date: Feb. 12, 2016

(87) PCT Pub. No.: WO2015/021490
PCT Pub. Date: Feb. 19, 2015

(65) Prior Publication Data
US 2016/0197279 A1    Jul. 7, 2016

(30) Foreign Application Priority Data

Aug. 14, 2013 (AT) .............................. A 50504/2013

(51) Int. Cl.
H01L 51/00 (2006.01)
C09B 57/00 (2006.01)

(52) U.S. Cl.
CPC .......... *H01L 51/0007* (2013.01); *C09B 57/00* (2013.01); *H01L 51/0003* (2013.01);
(Continued)

(58) Field of Classification Search
CPC .................... H01L 51/0007; H01L 51/0026
See application file for complete search history.

(56) References Cited

U.S. PATENT DOCUMENTS 4,539,507 A    9/1985    VanSlyke et al.
5,593,788 A    1/1997    Shi et al.
(Continued)

FOREIGN PATENT DOCUMENTS

EP    0 120 673 A2    10/1984
JP    H 10-189246 A    7/1998

OTHER PUBLICATIONS

Thur et al., "Epindolidione, Epindoline und lineare sowie trigonale Imidazolderivate", 2001, Dissertation zur Erlangung des Doktorgrades.*
(Continued)

*Primary Examiner* — Robert Vetere
(74) *Attorney, Agent, or Firm* — Collard & Roe, P.C.

(57) ABSTRACT

A method is described for applying an organic semiconductor layer based on epindolidione to a carrier. In order to provide advantageous production conditions it is proposed that the epindolidione is first reacted with tert-butyloxycarbonyl as protective group to give tert-butyloxycarbonyl epindolidione and then dissolved in a solvent before the dissolved tert-butyloxycarbonyl epindolidione is applied to the carrier, and that the solvent then be evaporated and the tert-butyloxycarbonyl protective group be detached again.

7 Claims, 1 Drawing Sheet

(52) U.S. Cl.
    CPC ........ *H01L 51/006* (2013.01); *H01L 51/0026* (2013.01); *H01L 51/0072* (2013.01)

(56) References Cited

U.S. PATENT DOCUMENTS

| | | |
|---|---|---|
| 5,811,156 A | 9/1998 | Roberts |
| 7,307,170 B2 | 12/2007 | Kaul et al. |
| 2005/0048406 A1 | 3/2005 | Burberry et al. |

OTHER PUBLICATIONS

Thur et al., "Epindolidione, Epindoline und lineare sowie trigonale Imidazolderivate", 2001, Dissertation zur Erlangung des Doktorgrades (machine translation).*

Wilma Thür: "Epindolidione, Epindoline und lineare sowie trigonale Imidazolderivate—Neue Materialien mit interessanten Fluoreszenzeigenschaften", Dissertation zur Erlangung des Doktorgrades., Jan. 1, 2001 (Jan. 1, 2001), XP055148694.

English translation of the Written Opinion of the International Searching Authority of PCT/AT2014/050169, dated Oct. 31, 2014.

International Search Report of PCT/AT2014/050169, dated Oct. 31, 2014.

* cited by examiner

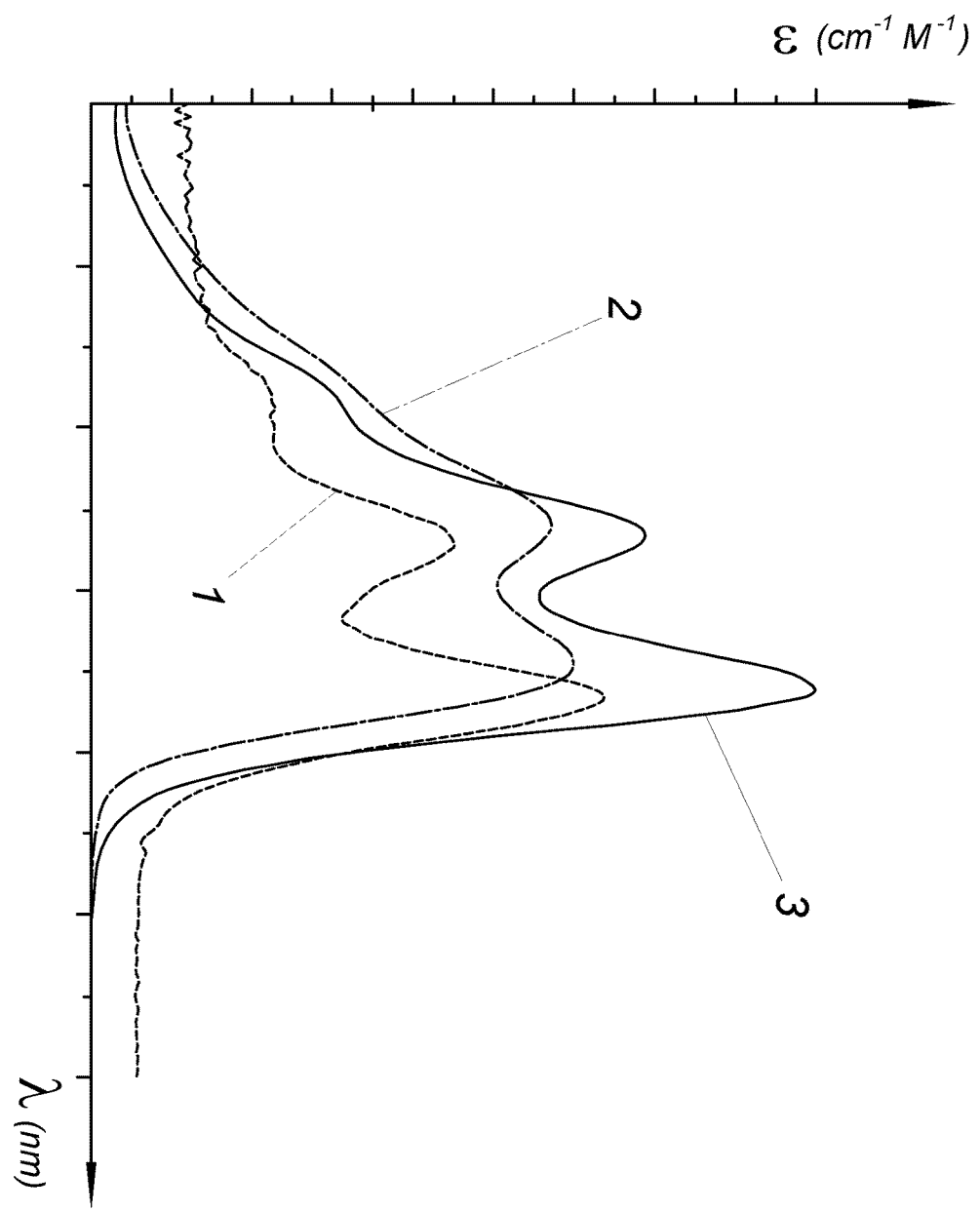

METHOD FOR APPLYING AN ORGANIC SEMICONDUCTOR LAYER BASED ON EPINDOLIDIONE TO A CARRIER

CROSS REFERENCE TO RELATED APPLICATIONS

This application is the National Stage of PCT/AT2014/050169 filed on Jul. 30, 2014, which claims priority under 35 U.S.C. §119 of Austrian Application No. A50504/2013 filed on Aug. 14, 2013, the disclosures of which are incorporated by reference. The international application under PCT article 21(2) was not published in English.

The invention relates to a method for applying an organic semiconductor layer based on epindolidione to a carrier.

Epindolidiones are especially used as colour pigment substances (US 2005048406 A1, U.S. Pat. No. 7,307,170 B2, U.S. Pat. No. 5,811,156 A) due to their light fastness and their insolubility, which are caused by hydrogen bridge bonding. It was further already proposed (JP H10189246 A) to utilise the fluorescence properties of epindolidiones for their use as organic semiconductors for devices with electroluminescence properties, which leads to difficulties however with respect to the substantial insolubility of the epindolidiones.

The invention is thus based on the object of utilising the properties of the substance class of epindolidiones as organic semiconductors without having to accept their disadvantages relating especially to their insolubility in particular with respect to a thin-film application on a carrier.

This object is achieved by the invention in such a way that the epindolidione is first reacted with tert-butyloxycarbonyl as protective group to give tert-butyloxycarbonyl epindolidione and then dissolved in a solvent, before the dissolved tert-butyloxycarbonyl epindolidione is applied to the carrier, and that the solvent then be evaporated and the tert-butyloxycarbonyl protective group be detached again.

The invention is based on the realisation that tert-butyloxycarbonyl epindolidione can be dissolved comparatively simply in different solvents, which facilitates the application of the respectively required semiconductor layer to a carrier and can be carried out with methods that conventionally apply thin layers in liquid form. Since the tert-butyloxycarbonyl protective groups can be detached again after an evaporation of the solvent, a substantially insoluble organic semiconductor layer based on epindolidione remains on the carrier, wherein it was surprisingly recognised that the epindolidiones applied to the carrier via the detour of the soluble tert-butyloxycarbonyl epindolidiones show substantially improved photo-physical properties in comparison with the substance class of the directly deposited epindolidiones.

The epindolidiones can be used both with one and also with two tert-butyloxycarbonyl protective groups as N-tert-butyloxycarbonyl epindolidione, or as N,N'-bis(tert-butyloxycarbonyl)-epindolidione.

As already mentioned above, the protective groups are to be detached again after the evaporation of the solvent from the layer of the epindolidione which is provided with at least one tert-butyloxycarbonyl protective group and which is applied to the carrier in order to provide the desired, substantially insoluble organic semiconductor layer. For this purpose, the solvent-free tert-butyloxycarbonyl epindolidiones can be subjected to pyrolysis by heat input, wherein the heating temperature can be between 80° C. and 250° C. depending on the application. After the detachment of the protective group or groups, the intermolecular and intramolecular hydrogen bonds which determine the stability of the semiconductor layer are present again.

Another possibility for detaching the at least one protective group is that the tert-butyloxycarbonyl epindolidione layer is treated after evaporation of the solvent with an acid vapour, wherein preferably the vapour of trifluoroacetic acid can preferably be used, although it is certainly possible to use other acid vapours such as the vapour of hydrochloric acid. The treatment of the tert-butyloxycarbonyl epindolidione layer, which is applied to a carrier, with acid vapour can also be supported by the supply of heat.

Different solvents can be used for dissolving the tert-butyloxycarbonyl epindolidiones. Typical solvents can be selected individually or in combination from a solvent group which contains chloroform, chlorobenzene, toluene, methylene chloride, hexanaphthene, and acetone.

An epindolidione with the following structural formula was used for producing N,N'-bis(tert-butyloxycarbonyl)-epindolidione and N-tert-butyloxycarbonyl epindolidione according to an embodiment:

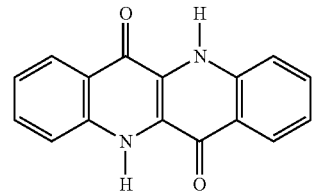 [SMILES: O=c1c2ccccc2[nH]c2c(=O)c3ccccc3[nH]c12]

100 mg (0.38 mmol) of said epindolidione was mixed with 414 mg (1.9 mmol) of di-tert-butyl dicarbonate (t-BOC$_2$O) and 93 mg (0.76 mmol) of N,N'-(dimethylamino)pyridine (DMAP) in 30 mL of dry tetrahydrofuran, wherein the mixture was stirred for 3 days under a nitrogen atmosphere. The solvent was then evaporated under reduced pressure. The residue was filtered through 30 g of silica gel with toluene/ethyl acetate (9:1).

The non-polar fractions contained 162 mg (19%) of N,N'-bis(tert-butyloxycarbonyl)-epindolidione (bis-BOC-epindolidione) as a yellow solid with the following structural formula:

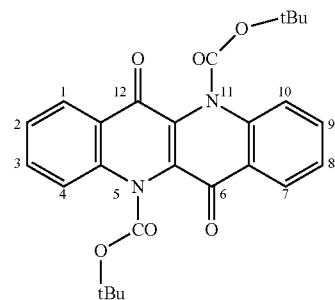

$R_f$=0.57 (toluene/ethylacetate, 9:1), sample decomposition temperature 221.3° C. (43.6%; theoretically for 2 isobutene/2 $CO_2$: 43.2%). IR: among others 3006 (vw, C—H$_{ar}$), 2987, 2937 (all w, C—H$_{al}$), 1758 (s, C=O$_{BOC}$), 1623 (s, C=O$_{ring}$), 1606 (s), 1477 (s). $^1$H-NMR (CDCl$_3$): 1.75 (s, 18H), 7.43 (t, J=8 Hz, 2H), 7.78 (t, J=8 Hz, 2H), 7.92 (d, J=8 Hz, 2H), 8.47 (d, J=8 Hz, 2H). ESI-MS: among others 501.20 (31, MK$^+$), 485.13 (52, MNa$^+$), 463.07 (42, MH$^+$), 363.07 (60 [MH—$CO_2$, —$C_4H_8$]$^+$), 307 (100 [MH-2

$CO_2$—$C_4H_8$)]$^+$), 263 (38 [M-2 $CO_2$, -2 $C_4H_8$]$^+$). Found: C, 67.09; H, 5.57; N, 5.41%. Calculated for $C_{26}H_{26}N_2O_6$: C, 67.52; H, 5.67; N, 6.06%.

The evaporation of the polar fractions produced 144 mg (76%) of N-tert-butyloxycarbonyl epindolidione (mono-BOC-epindolidione) with the structural formula:

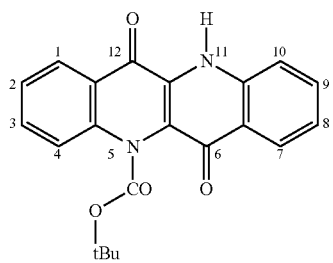 [SMILES: CC(C)(C)OC(=O)n1c2ccccc2c(=O)c2[nH]c3ccccc3c(=O)c21]

$R_f$=0.20 (toluene/ethylacetate, 9:1), sample decomposition temperature 214.0° C. (27.6%; theoretically for isobutene/$CO_2$: 27.9%). IR: among others 3241 (s, N—H), 1755 (s, C=$O_{BOC}$), 1602 (s), 1577 (s), 1489 (s). $^1$H-NMR (300 MHz, $CDCl_3$/($D_6$)DMSO): 1.77 (s, 9H), 7.38 (t, J=8 Hz, 1H), 7.45 (t, J=8 Hz, 1H), 7.57 (d, J=8 Hz, 1H), 7.76 (t, J=8 Hz, 1H), 7.8-7.9 (2H), 8.47 (d, J=8 Hz, 1H), 8.55 (d, J=8 Hz, 1H), 9.45 (s, 1H, N—H). ESI-MS: among others 747.20 (100, 2MNa$^+$), 401.00 (7, MK$^+$), 385.07 (26, MNa$^+$), 363.07 (71, MH$^+$), 307 (43, [MH—$C_4H_8$)]$^+$), 263 (47 [M—$CO_2$, —$C_4H_8$]$^+$). Found: C, 69.00; H, 4.96; N, 7.27%. Calculated for $C_{21}H_{18}N_2O_4$: C, 69.60; H, 5.01; N, 7.73%.

For the production of a thin-film semiconductor made of a tert-butyloxycarbonyl epindolidione, the mono-BOC-epindolidione or the bis-BOC-epindolidione is mixed with a solvent such as chloroform, and the obtained solution is deposited onto a carrier with a coating method conventionally used for wet application. In order to obtain the finished semiconductor layer, which is stable as a result of intermolecular and intramolecular hydrogen bonds, it is necessary to evaporate the solvent at first before the respective protective groups can be detached. The detachment of the protective groups can be carried out by heating the layer of the mono-BOC-epindolidione or the bis-BOC-epindolidione to a temperature of 80° C. to 250° C. The respective organic semiconductor layer is present after such pyrolysis.

Organic light-emitting diodes can be produced by means of the aforementioned coating method, in which the active semiconductor layer is provided between a transparent conductor layer and a conductive reflective layer. For this purpose, a solution of the bis-BOC-epindolidione can be applied by centrifugal casting onto a glass substrate as the carrier in a thin-film, which glass substrate is coated with indium tin oxide (ITO). After an evaporation of the solvent, pyrolysis can be carried out at 150° C. before a conductive covering layer made of aluminium is applied by vapour depositing.

Analogously, other electronic apparatuses such as field-effect transistors or photovoltaic elements can be produced by means of the organic semiconductors in accordance with the invention.

The photoelectric properties of the semiconductors in accordance with the invention are compared in the drawing to those of an epindolidione which is supplied directly to a carrier, which is provided on the basis of the molar absorption $\epsilon$ [$cm^{-1}M^{-1}$] entered on the ordinate as a function of the wavelength $\lambda$ [nm] which is entered on the abscissa. The characteristic curve 1, which is shown with the dashed line, corresponds to the molar absorption of a directly applied epindolidione, whereas the characteristic curve 2, which is shown with the dot-dash line, belongs to a semiconductor layer which was obtained via the detour of a dissolved mono-BOC-epindolidione. The characteristic curve 3, which is shown with the solid line, shows the absorption properties of an epindolidione layer which was applied to a carrier via the detour of a solution of a bis-BOC-epindolidione. The different absorption properties are shown directly in the drawing.

The invention claimed is:

1. A method for applying an organic semiconductor layer based on epindolidione to a carrier, wherein the epindolidione is first reacted with tert-butyloxycarbonyl as protective group to give tert-butyloxycarbonyl epindolidione and then dissolved in a solvent before the dissolved tert-butyloxycarbonyl epindolidione is applied to the carrier, and wherein the solvent then is evaporated and the tert-butyloxycarbonyl protective group is detached again.

2. A method according to claim 1, wherein the epindolidione is used with two tert-butyloxycarbonyl protective groups as N,N'-bis(tert-butyloxycarbonyl)-epindolidione.

3. A method according to claim 1, wherein the epindolidione is used with one tert-butyloxycarbonyl protective group as N-tert-butyloxycarbonyl epindolidione.

4. A method according to claim 1, wherein the tert-butyloxycarbonyl protective groups are detached from the tert-butyloxycarbonyl epindolidione by heating of the layer applied to the carrier.

5. A method according to claim 1, wherein the tert-butyloxycarbonyl protective groups are detached from the tert-butyloxycarbonyl epindolidione by a treatment with acid vapor of the layer applied to the carrier.

6. A method according to claim 5, wherein an evaporated trifluoroacetic acid is used as an acid vapor.

7. A method according to claim 1, wherein at least one solvent from the solvent group containing chloroform, chlorobenzene, toluene, methylene chloride, hexanaphthene and acetone is used as a solvent for the tert-butyloxycarbonyl epindolidione.

* * * * *